United States Patent
Yuan et al.

(10) Patent No.: US 9,727,685 B2
(45) Date of Patent: Aug. 8, 2017

(54) METHOD, APPARATUS, AND SYSTEM FOR IMPROVED STANDARD CELL DESIGN AND ROUTING FOR IMPROVING STANDARD CELL ROUTABILITY

(71) Applicant: GLOBALFOUNDRIES Inc., Grand Cayman (KY)

(72) Inventors: Lei Yuan, Sunnyvale, CA (US); Yan Wang, San Jose, CA (US); Chenchen Wang, Sunnyvale, CA (US); Jongwook Kye, Pleasanton, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 26 days.

(21) Appl. No.: 14/712,830

(22) Filed: May 14, 2015

(65) Prior Publication Data
US 2016/0335389 A1    Nov. 17, 2016

(51) Int. Cl.
*G06F 17/50*    (2006.01)

(52) U.S. Cl.
CPC ...... *G06F 17/5081* (2013.01); *G06F 17/5072* (2013.01); *G06F 17/5077* (2013.01)

(58) Field of Classification Search
USPC ............... 716/106, 110–111, 118–119, 123, 716/126–130, 139
See application file for complete search history.

(56) References Cited

U.S. PATENT DOCUMENTS

| | | | | |
|---|---|---|---|---|
| 8,893,073 B2 * | 11/2014 | Rashingkar | ......... | G06F 17/5077 703/15 |
| 2008/0111158 A1 * | 5/2008 | Sherlekar | ............ | G06F 17/5072 257/207 |
| 2008/0178135 A1 * | 7/2008 | Wu | ..................... | G06F 17/5068 257/798 |
| 2009/0083689 A1 * | 3/2009 | Ringe | ................ | G06F 17/5077 716/126 |
| 2012/0241986 A1 * | 9/2012 | Sherlekar | ............ | H01L 27/0207 257/784 |

* cited by examiner

*Primary Examiner* — Nghia Doan
(74) *Attorney, Agent, or Firm* — Williams Morgan, P.C.

(57) ABSTRACT

At least one method, apparatus and system disclosed involves circuit layout for an integrated circuit device. A design for an integrated circuit device is received. The design comprises a functional cell. A first substitute functional cell for a first value of shift of a set of routing tracks respective to the boundary of the functional cell is provided. The first substitute functional cell comprises at least one pin moved by an amount of the first value. A determination is made as to whether an amount of shift of the set of routing tracks corresponds to the first value. The functional cell is replaced with the first substitute functional cell in response to a determination that the amount of shift of the set of routing tracks corresponds to the first value.

19 Claims, 12 Drawing Sheets

METHOD, APPARATUS, AND SYSTEM FOR IMPROVED STANDARD CELL DESIGN AND ROUTING FOR IMPROVING STANDARD CELL ROUTABILITY

BACKGROUND OF THE INVENTION

Field of the Invention

Generally, the present disclosure relates to the manufacture of sophisticated semiconductor devices, and, more specifically, to various methods and structures for using improved standard cells improved cell routability for manufacturing semiconductor devices.

Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using semiconductor-manufacturing tools, such as exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one conductive region on the semiconductor wafer to another.

In this manner, integrated circuit chips may be fabricated. In some cases, integrated circuit or chips may comprise various devices that work together based upon a hard-coded program. For example, application-specific integrated circuit (ASIC) chips may use a hard-coded program for various operations, e.g., boot up and configuration processes. The program code, in the form of binary data, is hard-coded into the integrated circuit chips.

When designing a layout of various devices with an integrated circuits (e.g., CMOS logic architecture), designers often select pre-designed functional cells comprising various features (e.g., diffusion regions, transistors, metal lines, vias, etc.) and place them strategically to provide an active area of an integrated circuit. One challenge of designing a layout is accommodating ever-increasing density of cell components and still maintain routability for connecting various components of the cells. This is increasingly a challenge as dimensions of these components get smaller, such as for 10 nm or lower integrated circuit designs.

Figure 1:
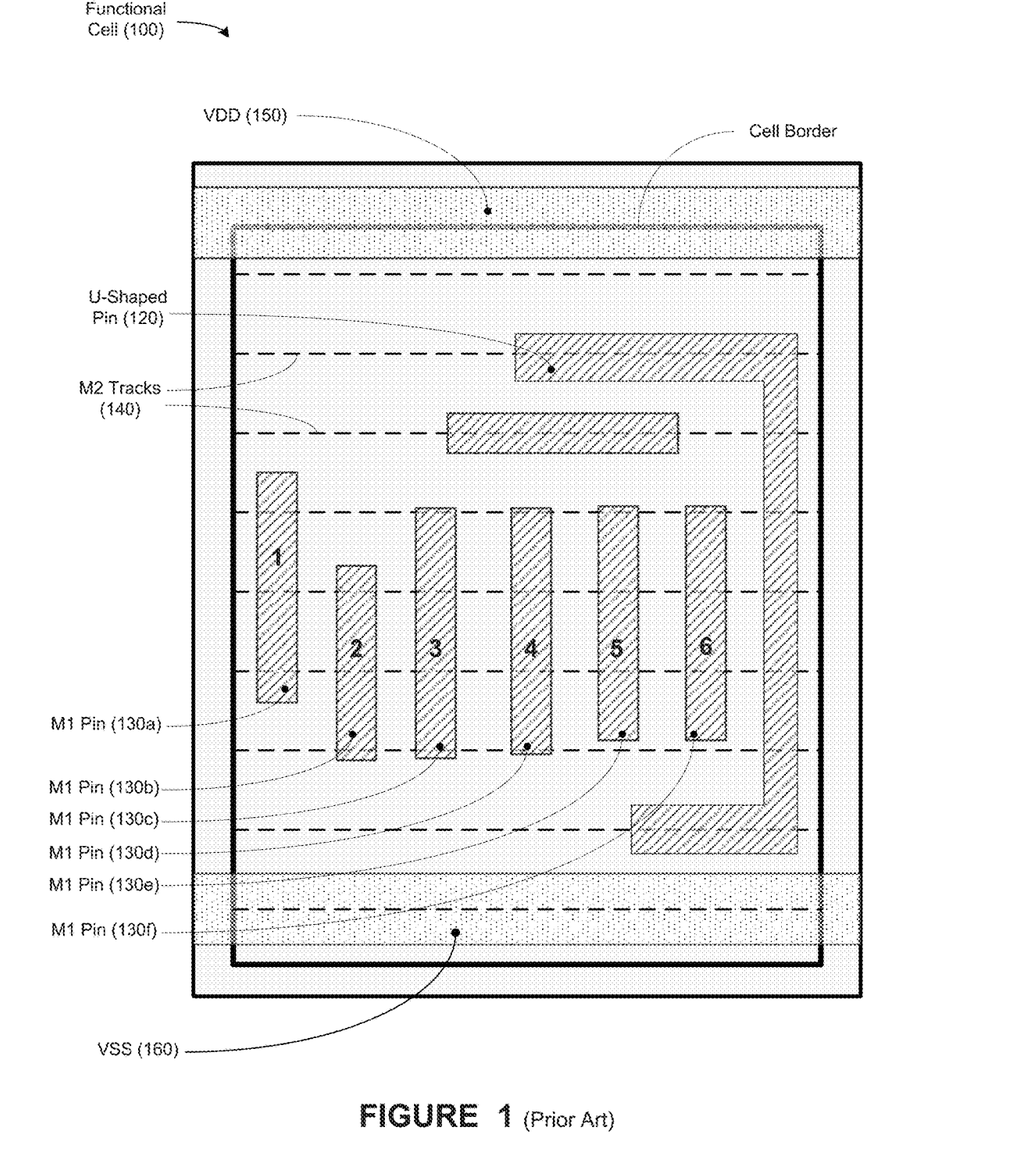
FIG. 1 illustrates a stylized depiction of a typical, standard 9-track, 10 nm cell.

FIG. 1 illustrates a typical standard cell for a 10 nm node design. A cell 100 comprises a plurality of Metal-2 (M2) routing tracks 140. The cell 100 is an example of a 9-track cell, which may comprise a plurality of components that densely populate the cell. The cell 100 comprises six metal pins (130a-130f) (e.g., Metal-1 (M1) metal pins). The six metal pins 130a-130f are input pins. The cell 100 also includes an output "U-shaped" pin 120. The cell 100 includes a VDD metal connection on one routing track 140, and a VSS metal connection on another routing track 140.

As shown in FIG. 1, metal pins 130b-130f are required to be connected using only two routing tracks 140. Metal pin 130a may be connected using three routing tracks. As such, three metal tracks 140 have to be used to connect all six input pins 130a-130f. In light of the VDD line 150, the VSS line 160, the output pin 120, the utilization of three M2 tracks 140 to connect the six input pins 130a-130f can cause the cell 100 to become very difficult to connect. This causes routing-congestion and causes the routing task to be more difficult.

In order to alleviate some of the routing concerns, designers have turned to manually placing M2 pins in cell design. Manually placed M2 pins can be optimized to maximize pin accessibility that cannot be done by design automation tool (router) because the automation tool need be implemented on the full chip scale, and thus, cannot properly perform thorough optimization.

Figure 2:
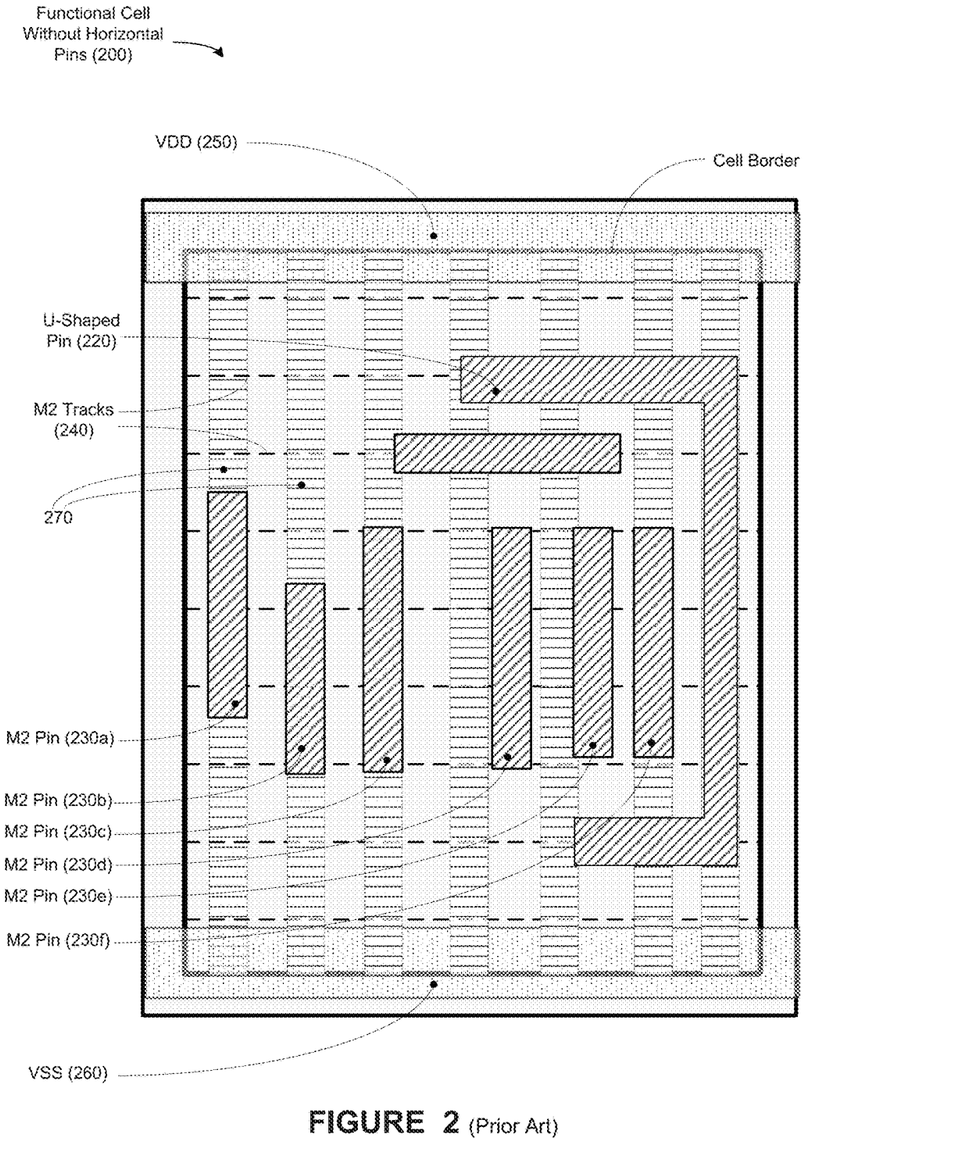
FIG. 2 illustrates a stylized depiction a typical cell without horizontal M2 pins.
Figure 3:
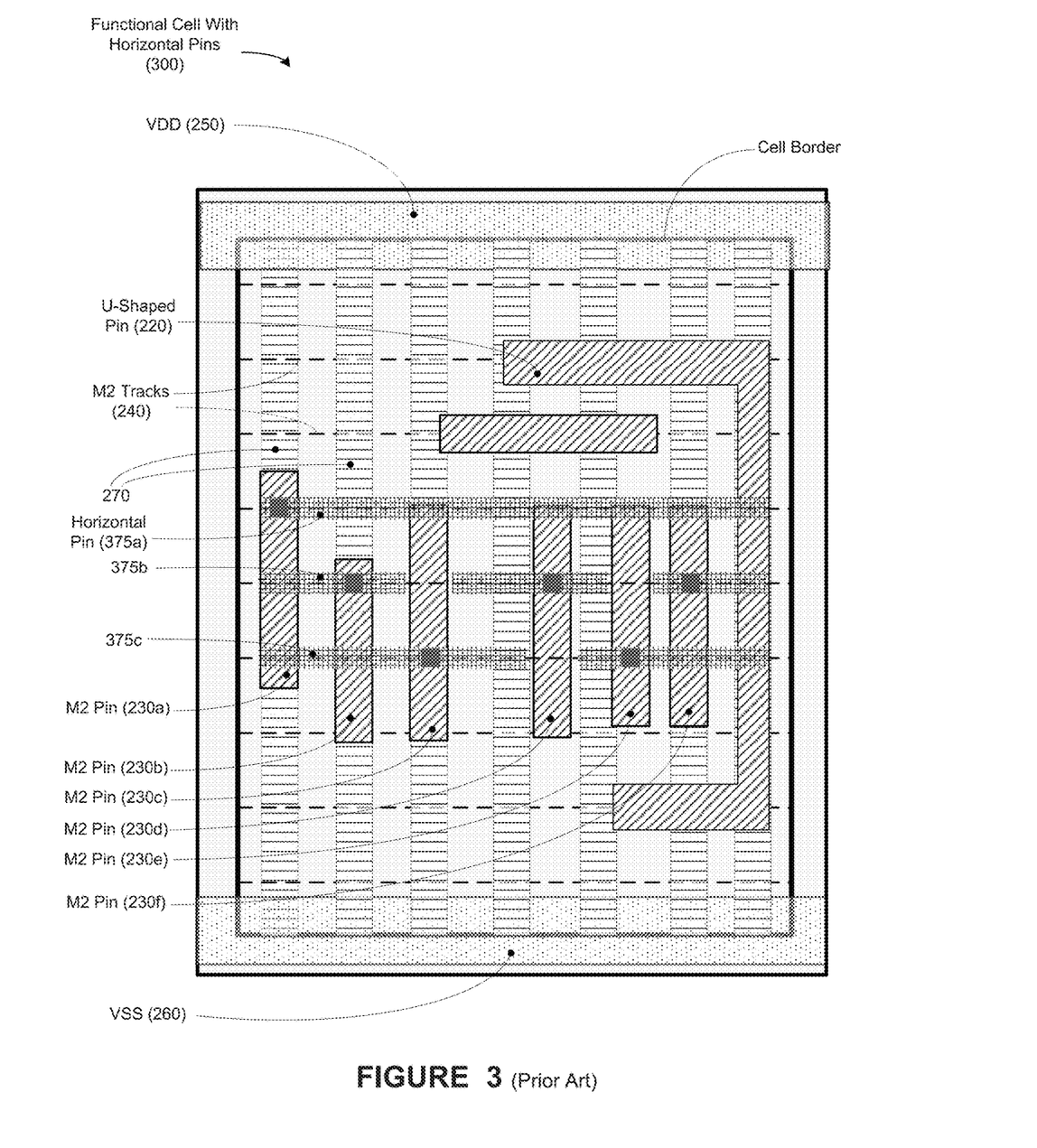
FIG. 3 illustrates a stylized depiction of a typical cell comprising horizontal M2 pins.

Turning now to FIGS. 2 and 3, FIGS. 2 illustrates a typical cell without horizontal M2 pins, wherein FIG. 3 illustrates a typical cell comprising horizontal M2 pins. FIG. 2 illustrates a cell 200 that comprises a layout without horizontal M2 pins. The cell 200 includes a plurality of vertical M1 pins. The cell 200 includes six input M1 pins (230a-230f), and an output pin 220. The cell 200 also includes a plurality of vertical semiconductor formations 270, e.g., gate formations for a transistor. The cell 200 also includes a plurality of horizontal metal tracks 240. At boundary of the cell 200, on a metal VDD line 250 and a metal VSS line 260 are defined.

FIG. 3 illustrates a cell 300, on which horizontal M2 pins are manually placed and optimized. A plurality of horizontal M2 metal pins (375a-375c) may be manually defined onto the cell 300. Manually adding the M2 horizontal metal formations provides for extending pin accessibility. Some of the M2 pins (375b, 375c) are generally not continuous lines, wherein 375b and/or 375c may represent a plurality of non-continuous M2 horizontal metal formations. The fact that some of the M2 pins (375b, 375c) are generally not continuous lines can make it difficult or substantially impossible for an automated router to process the design.

Figure 4:
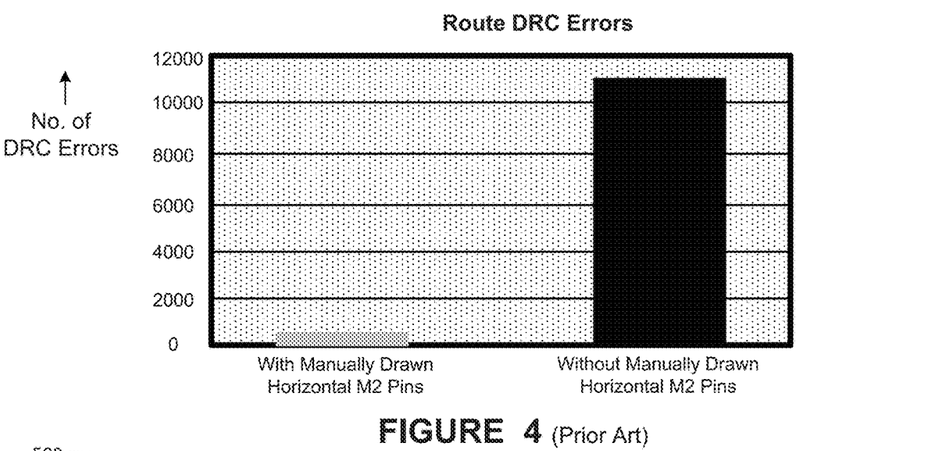
FIG. 4 illustrates a stylized chart showing a typical design rule check (DRC) error detection.

FIG. 4 shows the DRC error results of the routing experiment for the function cell 200 and 300 as shown in FIG. 2 and FIG. 3 respectively. The DRC errors may include spacing error, pin width errors, and/or enclosure errors. Using electronic design automation (EDA) router tools to implement automated horizontal pin for the function cell 200, which leads to congestion and difficulties in routing, a large number of DRC errors results. As shown in FIG. 4, using manually added horizontal pins for the function cell 300, the routing efficiency is significantly improved and a much lower number of DRC errors result. One common problem associated with manually drawn horizontal M2 pins is that it is not possible to optimize the horizontal M2 pin design toward the M3 route track. This is so because the M3 route track is not fixed in relation to the cell boundary, and its actual shift relative to the cell boundary after cell placement cannot be predicted during the cell design phase.

Figure 5:
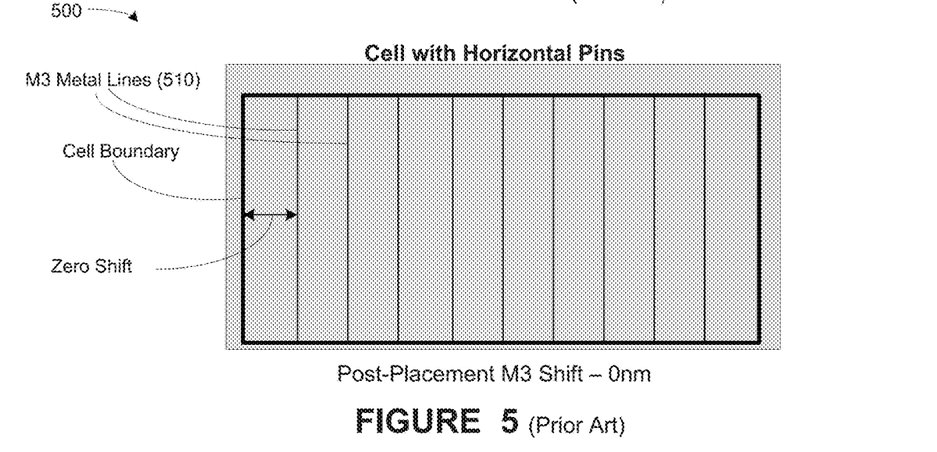
FIG. 5 illustrates a stylized depiction of a cell showing a post-placement M3 route track with zero shift relative to the cell boundary.
Figure 6:
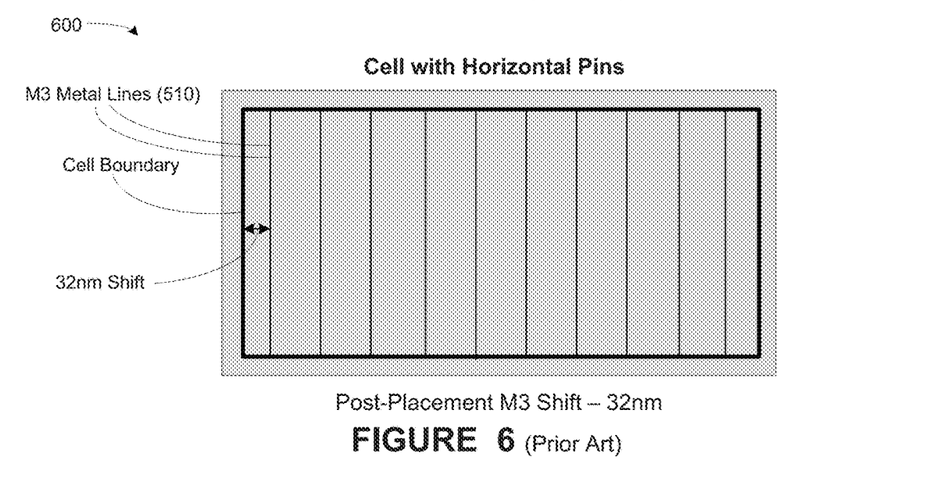
FIG. 6 illustrates a stylized depiction of a cell showing a post-placement M3 route track with a 32 nm shift relative to the cell boundary.

Turning now to FIGS. 5 and 6, FIG. 5 illustrates a stylized depiction of a cell showing a post-placement M3 route track with zero shift relative to the cell boundary, while FIG. 6 illustrates a stylized depiction of a cell showing a post-placement M3 route track with a 32 nm shift relative to the cell boundary. Both cells have the exact same design and function and show different M3 route track shift because they are placed in different locations in the circuit layout. The cells of FIGS. 5 and 6 may be a 10 nm cell containing a poly pitch of 64 nm and a metal pitch (M1, M2, M3) of 48 nm. FIG. 5 illustrates a cell 500 that comprises a plurality of M3 tracks 510. As shown in FIG. 5, the M3 tracks are spaced exactly a pitch width from the cell boundary, thus a zero shift. FIG. 6 illustrates a cell 600 that comprises a plurality of M3 tracks 510. As shown in FIG. 6, the M3 tracks are not spaced exactly a pitch width from the cell boundary, but is shifted by 32 nm from the cell boundary, thus a 32 nm shift.

Generally, the M2 route tracks in conventional standard cells are fixed relative to the cell boundary, while the M1 pins are generally optimized toward the M2 route track to maximize pin accessibility. In conventional standard cells that have horizontal M2 pins, one problem is that the M3 route tracks are not fixed or anchored to the cell boundary, as indicated in FIG. 6. This mismatch is generally caused by a mismatch between the poly-pitch (64 nm) and the M3 pitch (48 nm). As such, it is substantially impossible to optimize any manually drawn M2 pin relative to the M3 route track. This is yet another problem associated with manually drawing M2 pins for overcoming routing problems in a congested cell.

Figure 7:
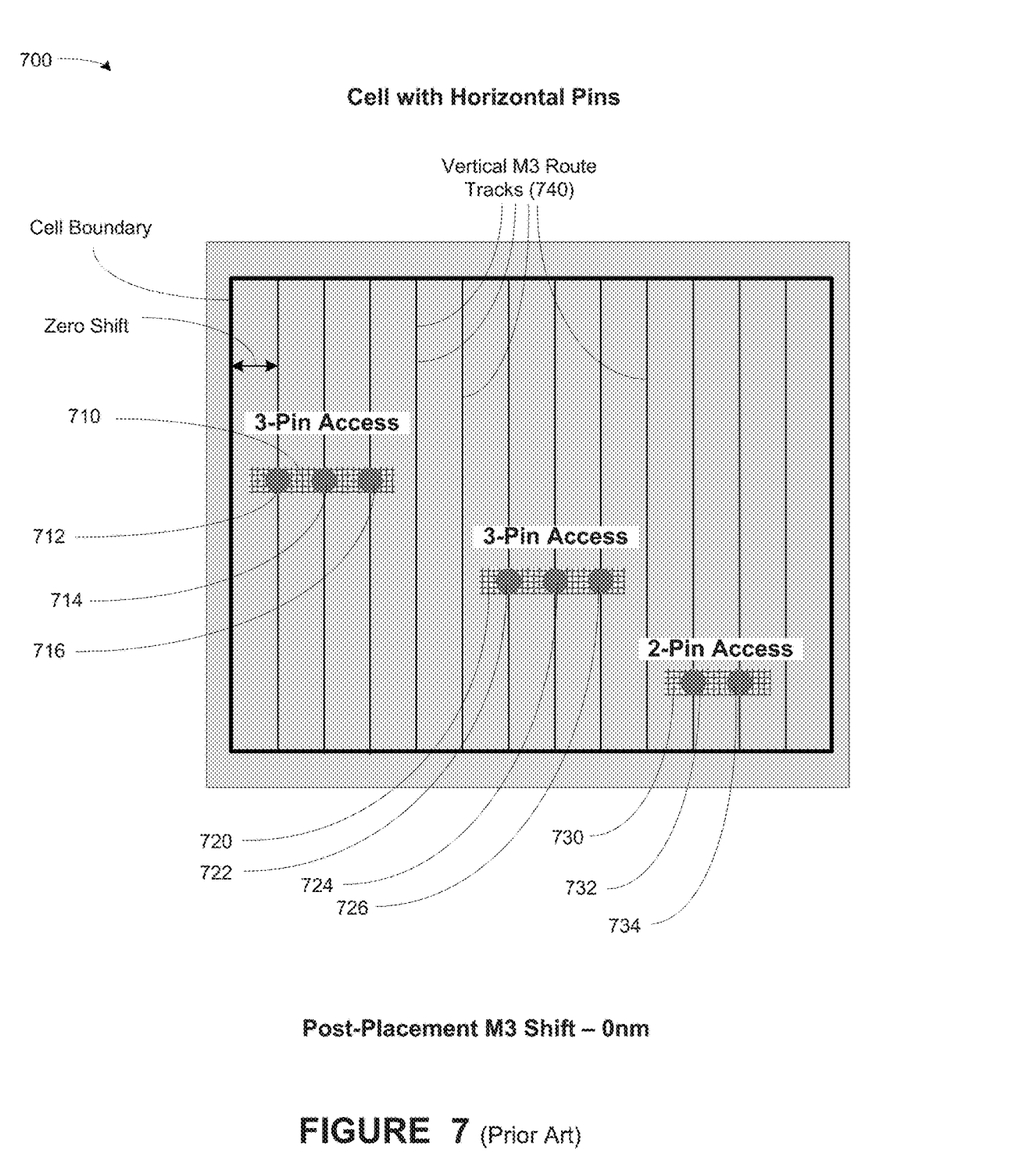
FIG. 7 illustrates a stylized depiction of a cell showing a pin access relative to an M3 route track with zero shift relative to the cell boundary.
Figure 8:
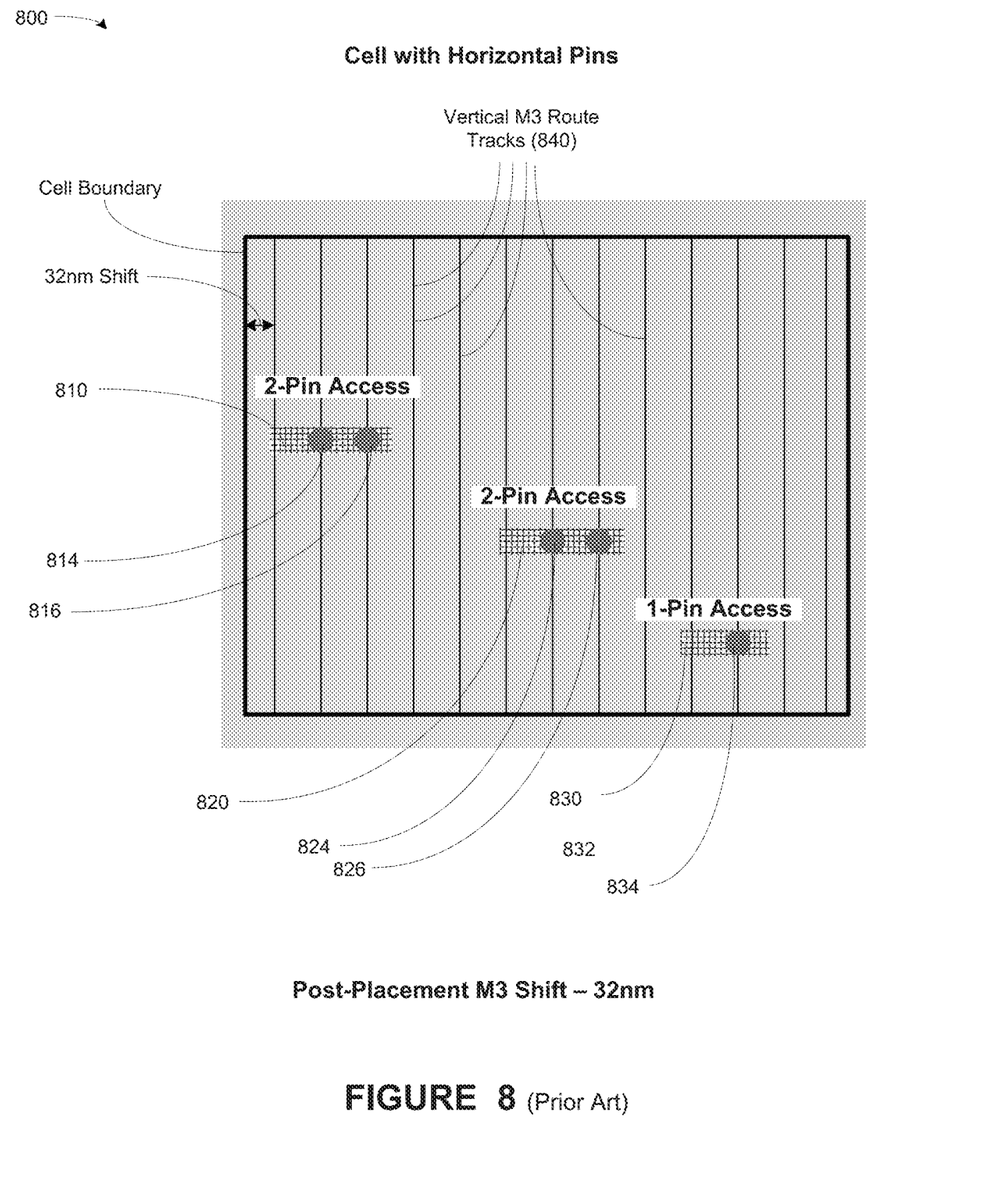
FIG. 8 illustrates a stylized depiction of a cell showing a pin access relative to an M3 route track with a 32 nm shift relative to the cell boundary.

One problem associated the M3 shift described above is a possibility of poor accessibility to features formed due to the shift (e.g., 32 nm) described above. Turning now to FIGS. 7 and 8, FIG. 7 illustrates a stylized depiction of a cell showing a pin access relative to an M3 route track with zero shift relative to the cell boundary, while FIG. 8 illustrates a stylized depiction of a cell showing a pin access relative to an M3 route track with a 32 nm shift relative to the cell boundary.

FIG. 7 illustrates a functional cell 700 that comprises a plurality of vertical M3 route tracks 740. The cell 700 also comprises a first integrated circuit feature 710 (e.g., M2 horizontal pin), a second integrated circuit feature 720, and an integrated third circuit feature 730. The features 710-730 (e.g., M2 horizontal pins) are positioned over the M3 routing tracks in such a manner that a maximum number of pin access points can be used to gain access to the M3 metal layer. Accordingly, three pin access points 712, 714, 716 can potentially be utilized by M3 route to connect to the feature 710. In the route technology, more pin access points will provide better routing efficiency and routing density. The three pin access point 722, 724, 726 can potentially be utilized by M3 route to connect to the feature 720. The two pin access points 732, 734 can potentially be utilized by M3 route to connect to the feature 730.

As shown in FIG. 8, a shift in the M3 routing track could cause a reduction in the number of pin accesses that can be provided to the features 710-730. FIG. 8 illustrates a functional cell 800 that comprises a plurality of vertical M3 route tracks 840. FIG. 8 shows a cell 800 that comprises the features and the corresponding pin access points similar to the description in the context for FIG. 7 above.

The cell 800 comprises a first integrated circuit feature 810, a second integrated circuit feature 820, and an integrated third circuit feature 830. The M3 routing tracks 840 are shifted by about 32 nn. This shift may be the result of a mismatch between the M3 pitch (e.g., 48 nm) and the poly-pitch (e.g., 64 nm) of the cell 800. The features 810-830 (e.g., M2 horizontal pins) are positioned over the M3 routing tracks in such a manner that a maximum number of pin access points can be used to gain access to the M3 metal layer at zero shift of M3 track to the cell boundary.

However, due to the shift between the M3 routing track 840 and the cell boundary, less than optimum number of pin access points can be provided on the features 810-830. For example, due to the shift, only two pin access points (814, 816) can be formed on the feature 810, providing a 2-pin access. As a result of the shift, only two pin access points (824, 826) can be provided on the feature 820, providing only a 2-pin access. Further, due to the shift, only a single pin access point 834 can be provided on the feature 830, providing only a 1-pin access. Therefore, the same horizontal pin design implemented into a cell (FIG. 7) that provides sufficient pin accessibility in a zero-shift cell is compromised and results in poor pin accessibility in a cell (FIG. 8) that has a 32 nm M3 route track shift. Because of the shift described above, there is less access to metal lines, which may cause routing problems, Thus, there are limited resources for connect to other cells due to the congestion. Therefore, as described above, there are various inefficiencies, errors, and other problems associated with the state-of-art.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for designing a circuit layout for an integrated circuit device. A design for an integrated circuit device is received. The design comprises a functional cell. A first substitute functional cell for a first value of shift of a set of routing tracks respective to the boundary of the functional cell is provided. The first substitute functional cell comprises at least one pin moved by an amount of the first value. A determination is made as to whether an amount of shift of the set of routing tracks corresponds to the first value. The functional cell is replaced with the first substitute functional cell in response to a determination that the amount of shift of the set of routing tracks corresponds to the first value.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for performing a standard cell optimization process for reducing the effects of a routing track shift in the cell. A track shift optimization process may be performed to reduce the effect of a shifting of a set of routing tracks (e.g., metal routing tracks, such as M3 routing tracks) relative to the cell boundary of the cell. Some embodiments herein call for implementing a predetermined, substitute cell that comprises an adjusted set of horizontal pins for each shift amount. For example, based upon a first shift value, a predetermined first substitute cell or "child" cell may be defined. In the event a cell with a first shift value (e.g., the M3 routing track is shifted relative to the cell boundary by the first shift value) is detected, the substitute cell is used in place of the cell with the first shift value. Therefore, routing issues due to the shift may be reduced.

Figure 9:
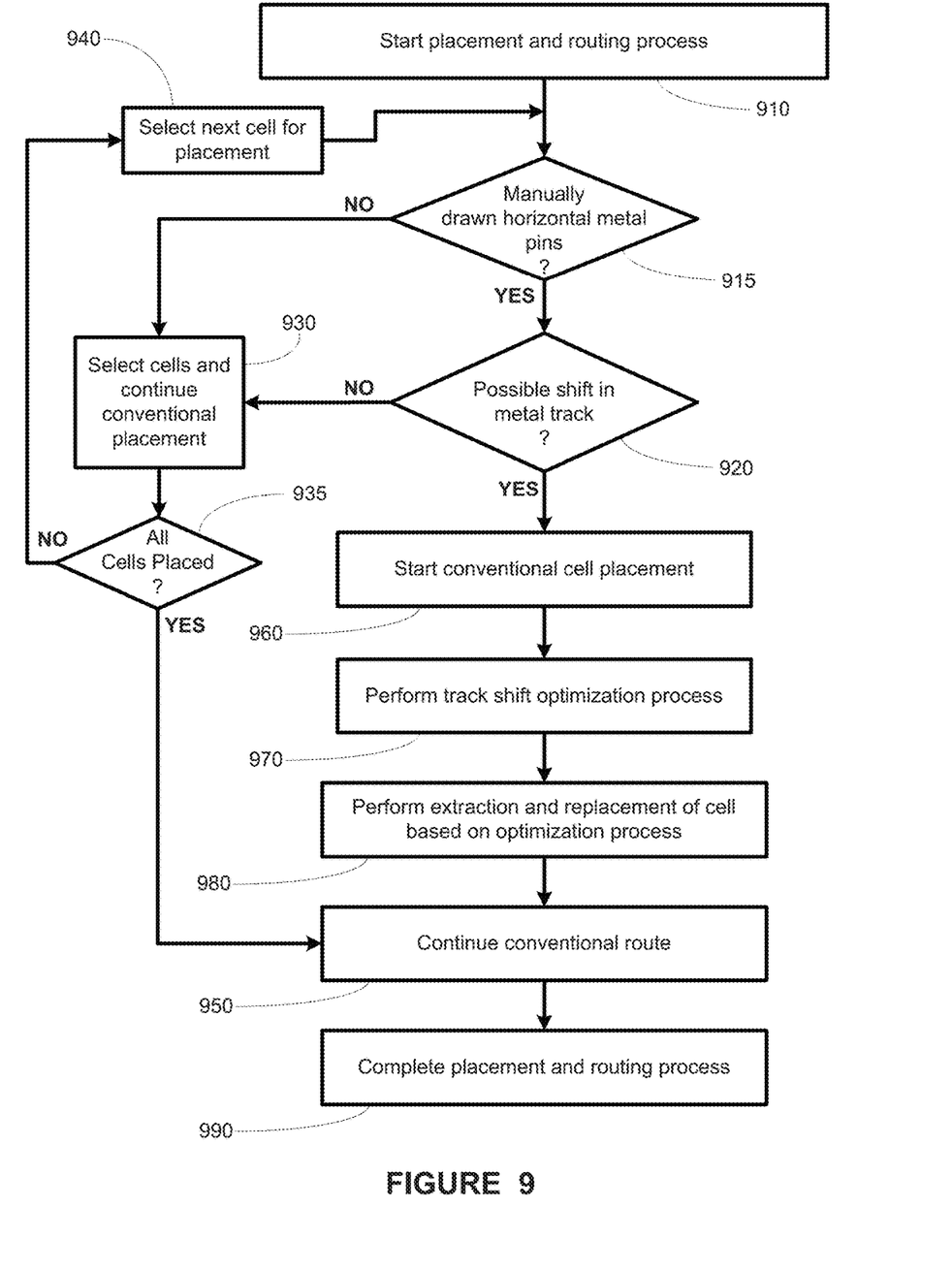
FIG. 9 illustrates a flowchart representation of a method for performing a track shift optimization process, in accordance with embodiments herein.

Turning now to FIG. 9, a flowchart representation of a method for performing a track shift optimization process, in accordance with embodiments herein, is illustrated. A placement and routing process for designing an integrated circuit may be initiated (block 910). This process may call for using a plurality of standard functional cells to design various devices for the integrated circuit. A determination may be made as to whether there are any manually drawn horizontal metal pins (block 915). If there are no manually drawn horizontal pins, then the cells are selected for the design and the placement process is continued (block 930). If a determination is made that there are manually drawn horizontal pins (block 915), a determination may then be made as to whether a possible shift of the routing tracks of a metal layer relative to the cell boundary is found (block 920). For example, the M3 metal routing track set may be shifted from the cell boundary. This may occur due to the mismatch between various features of the cell, such a mismatch between the poly-pitch and the M3 metal layer pitch.

If a determination is made that there is no shift of the routing tracks of a metal layer relative to the cell boundary has or may occur, the cells are selected for the design and the placement process is continued (block 930). A determination is made whether all cells required for the design have been placed (block 935). If all cells have not been placed (block 935), the next cell is selected for placement (block 940). Once all cells have been placed, a routing process is performed to connect various components of the cells, and the cells themselves (block 950). Subsequently, the routing and placement process is concluded (block 990).

If a determination is made that there is a potential for a shift of the routing tracks of a metal layer relative to the cell boundary, a normal cell placement process is performed (block 960). This process may be followed by a track shift optimization process is (block 970). The track shift optimization process calls for providing a substitute cell to reduce the effect of the metal track shift of the cell comprising the shift. A more detailed description of the track shift optimization process is provided in FIG. 10 and accompanying description below.

Once the track shifting optimization process is performed (block 970), in some embodiments, additional check(s) may be made and further optimization process(es) may be performed. An extraction and replacement of cell(s) that have shifts may be performed, based upon the optimization process (block 980). This process includes removing certain cells with shift issues and replacing those cells with modified, substitute or "child" cells. A more detailed description of extracting and replacing cells based upon the optimization process is provided in FIG. 11 and accompanying description below.

Figure 10:
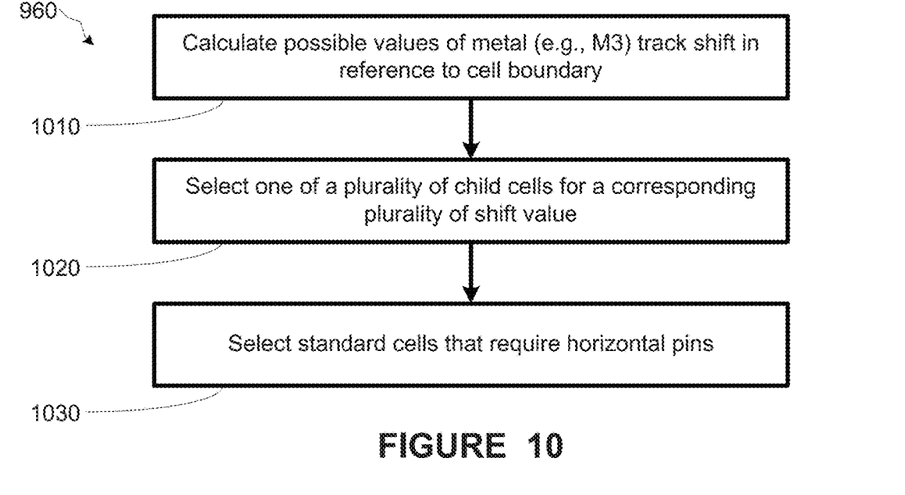
FIG. 10 illustrates a flowchart depiction of the process of performing the shift optimization process of FIG. 9, in accordance with embodiments herein.
Figure 12:
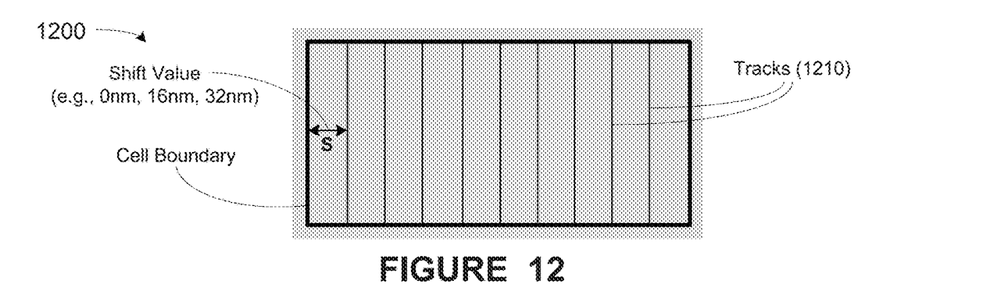
FIG. 12 illustrates a functional cell 1200 comprising a plurality of horizontal routing tracks 1210.

Turning now to FIG. 10, a flowchart depiction of the process of performing the shift optimization process of FIG. 9, in accordance with embodiments herein is illustrated. A calculation may be made as to the possible value of the routing track shift in reference to the cell boundary (block 1010). For example, a determination may be made that the M3 routing tracks are shifted by 32 nm relative to the cell boundary. Referring to FIG. 12, a functional cell 1200 comprising a plurality of horizontal routing tracks 1210 with respect to some embodiments, is illustrated. The routing tracks are shifted by the amount "S," relative to the cell boundary, as shown in FIG. 12. The exemplary cell 1200 comprises a poly-pitch of 64 nm and an M3 pitch of 48 nm. Thus, an M3 shift of zero, 16 nm, or 32 nm may be possible. In other embodiments, a different combination of a poly-pitch and M3 pitch may provide for a different value of possible shift of vertical M3 track in reference to the cell boundary.

One or more substitute or child cells for replacing a cell with a shift may be selected based upon the possible value of the routing track shift (block 1020). In one embodiment, a plurality of substitute/child cells may be generated prior to the route and place process (block 910) for a plurality of likely routing track shifts. This process may comprise adjusting the horizontal track to compensate for the amount of shift (e.g., 16 nm or 32 nm shift). For example, for each type of shift (e.g., a 32 nm shift), a substitute or "child" cell may be generated which has optimized horizontal pins corresponding to that particular shift. The substitute/child cell may be substantially identical to the original or "parent" cell except for some adjustments to horizontal pins for compensating for the shift and optimizing the number of access points for the those horizontal pins. A plurality of substitute cells may be generated for a corresponding plurality of types of shift. These substitute cells may then be stored into a database for later extraction.

Continuing referring to FIG. 10, based upon the value of the shift, a standard cell that require horizontal pins that closely match the design requirements is selected (block 1030). The substitute/child cell may then be used by the process described in FIG. 9. In some alternative embodiments, the selection of standard cells that require horizontal pins (1030) may be performed prior to step 1010.

Figure 11:
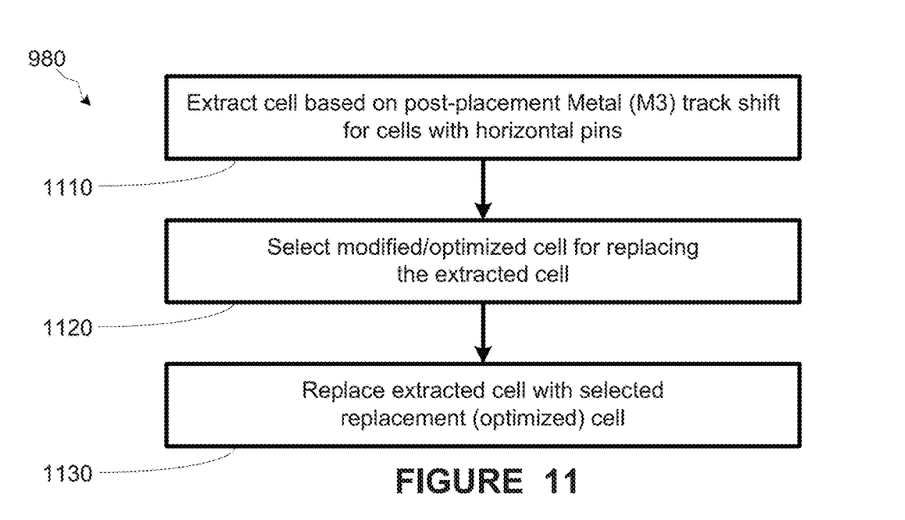
FIG. 11 illustrates a flowchart depiction of the step of performing the extraction and replacement of cell based upon the optimization process of FIG. 9, in accordance with some embodiments herein.

Turning now to FIG. 11, a flowchart depiction of the step of performing the extraction and replacement of cell based upon the optimization process of FIG. 9, in accordance with some embodiments herein, is illustrated. Once a track shift is detected is detected and a cell placement process is started, an extraction of the shifted cell may be performed based upon the optimization process (block 1110). This process comprises removing the cell with the shift and replacing the cell that is found to have a shift (e.g., an M3 vertical shift).

Subsequently, upon extracting the cell comprising the shift, a substitute or child cell that corresponds to the amount of shift is selected (block 1120) e.g., from the pre-generated database. The selected substitute cell is then used to replace the corresponding cell comprising the shift (block 1130). In this manner, cells comprising the shifts are replaced with substitute/child cells that comprise adjusted horizontal metal pins that may provide for more efficient pin accessibility. The substitute cells and then used by the process of FIG. 9 to complete the placement and routing of the integrated circuit design.

Figure 13:
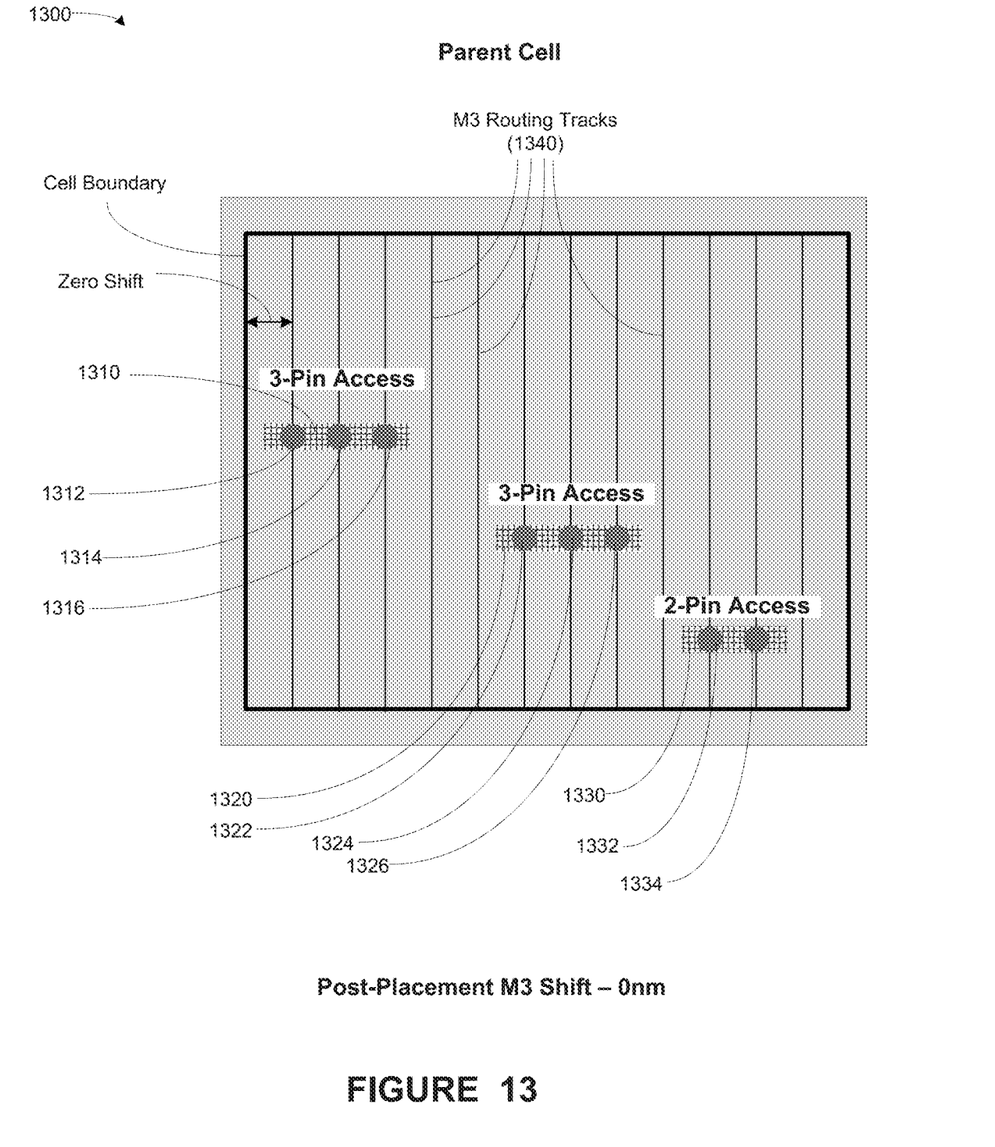
FIG. 13 illustrates a stylized depiction of a cell that comprises a plurality of horizontal M3 route tracks with zero shift.
Figure 14:
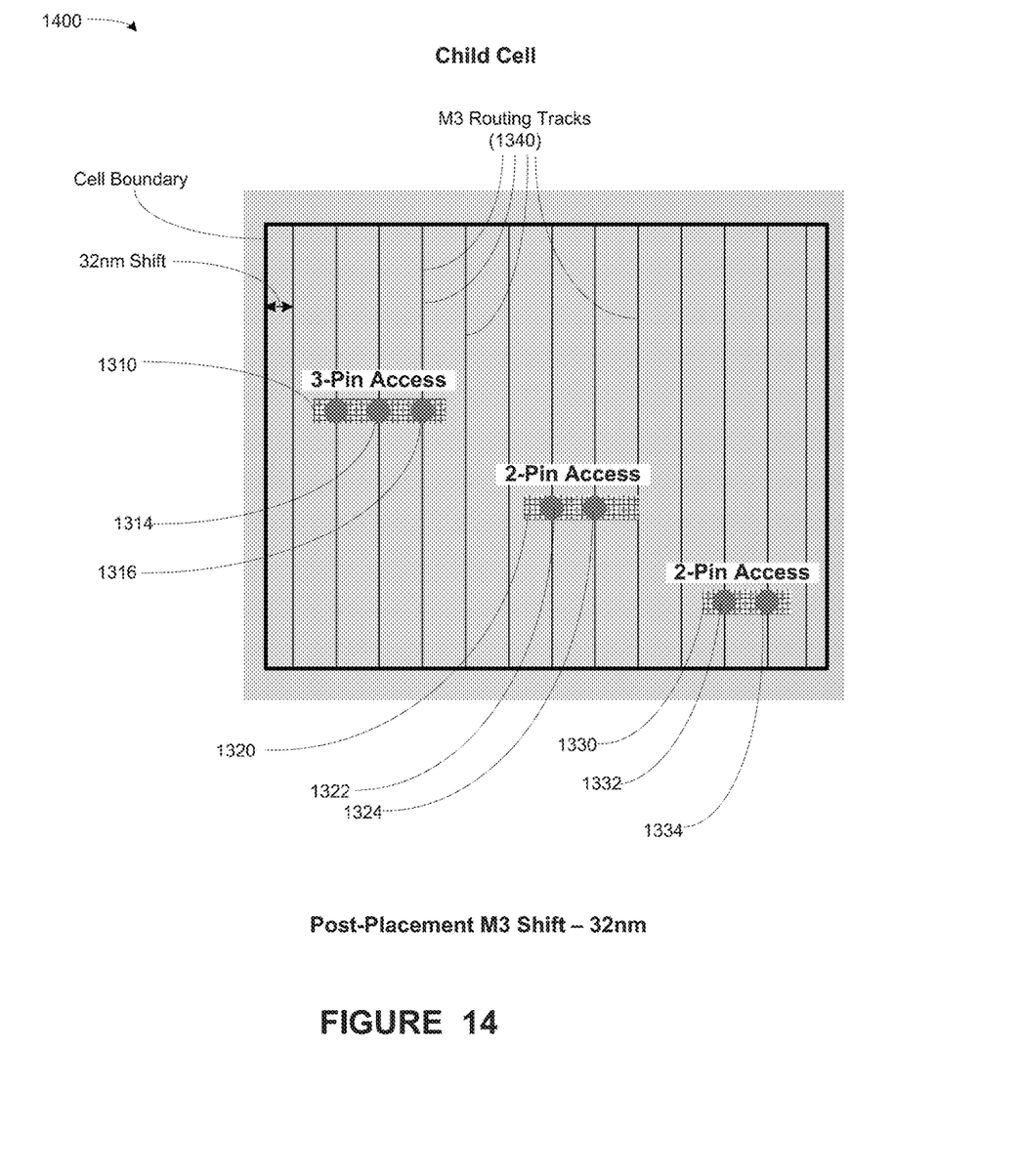
FIG. 14 illustrates a stylized depiction of a substitute cell that comprises a plurality of horizontal M3 route tracks with a shift.

Turning now to FIGS. 13 and 14, FIG. 13 illustrates a stylized depiction of a cell that comprises a plurality of horizontal M3 route tracks with zero shift, and FIG. 14 illustrates a stylized depiction of a substitute cell that comprises a plurality of horizontal M3 route tracks with a shift. The functional cell 1300 of FIG. 13 is an original standard cell, wherein the functional cell 1400 of FIG. 14 is substitute or child cell of the parent cell. The substitute cell 1400 may be used to replace the cell 1300 if a shift of the M3 routing tracks is discovered.

The cell 1300 of FIG. 13 comprises a first integrated circuit feature 1310, a second integrated circuit feature 1320, and an integrated third circuit feature 1330. The features 1310-1330 are positioned over the M3 routing tracks 1340 in such a manner that a maximum number of pin access points can be used to gain access to the M3 metal layer. Accordingly, access points 1312, 1314, 1316 are formed on the feature 1310 (e.g., M2 horizontal pin) along the M3 route tracks 1340 for providing a 3-point access (i.e., 3-via access) to the feature 1310. Access points 1322, 1324, 1326 are formed on the feature 1320 (e.g., M2 horizontal pin) along the M3 route tracks 1340 for providing a 3 pin access points to the feature 1320. Access points 1332, 1334 are formed on the feature 1330 (e.g., M2 horizontal pin) along the M3 route tracks 1340 for providing a 2 pin access points to the feature 1330. In some embodiments, only one access point may be used to connect to the features 1310, 1320, 1330.

The child cell 1400 also comprises the first through third features 1310, 1320, 1330. Further, the child cell 1400 was created for a 32 nm shift. Since the amount of shift (32 nm) was known, the child cell was created with the horizontal pin being shifted to match the amount of relative shift between the cell boundary and the vertical M3 wire. That is, knowing the amount of shift to compensate for, the horizontal M2 pins may be shifted accordingly, while keeping the location of components of the other layers in the cell the same. The horizontal cells are shifted to better line-up with the shifted vertical lines in order to provide for better access points of features formed in the cell. In light of this adjustment, the pin access points 1312, 1314, 1316 were maintained over the first feature 1310 (e.g., M2 horizontal pin) since they were lined up with the vertical lines after the adjustment. However, only two pin access points (1322 and 1324) were maintained over the second feature 1320 since only 1322 and 1324 were lined up with the vertical M3 lines after the adjustment. Further, the two pin access points (1332, 1324) were maintained over the third feature 1330.

Therefore, by adjusting to the 32 nm shift in the M3 routing tracks 1340 by shifting the horizontal pin to match that shift amount, most of the pin access were maintained in the child cell 1400. Without the child cell 1400, a lesser amount of pin access would've been provided at 32 nm shift. In this example, pin access points of 3-3-2 (respectively for the first through third features) were maintained to a pin access of 3-2-2 using the child cell 1400. In contrast, without the child cell 1400, a pin access of only 2-2-1 would have resulted (as exemplified in FIG. 8). In a similar fashion, another substitute or child cell may be created for a 16 nm M3 routing track shift for preserving a substantial number of pin access locations. Similar adjustments may be made to more complex functional cells as exemplified in FIG. 3, wherein a replacement or child cell with adjustments to the horizontal formations may be made to compensate for any shifts and remain within the spirit and scope of the present disclosure. In some embodiments, a valid pin access point refers to a location within the associated pin where a via can be implemented within design rules in order to connect the associated pin to a metal route wire (i.e., track). Implementing a via within the design rules may comprise examples such as forming/designing a via that satisfies via enclosure rules, etc. Even though multiple pin access points for a metal pin are provided, in some embodiments, generally only one pin access point is used for via insertion and metal routing. In alternative embodiments, a plurality of access points may be used to provide for via insertion, such as providing for more robust connection for higher drive currents, or meeting various resistivity specifications.

Figure 15:
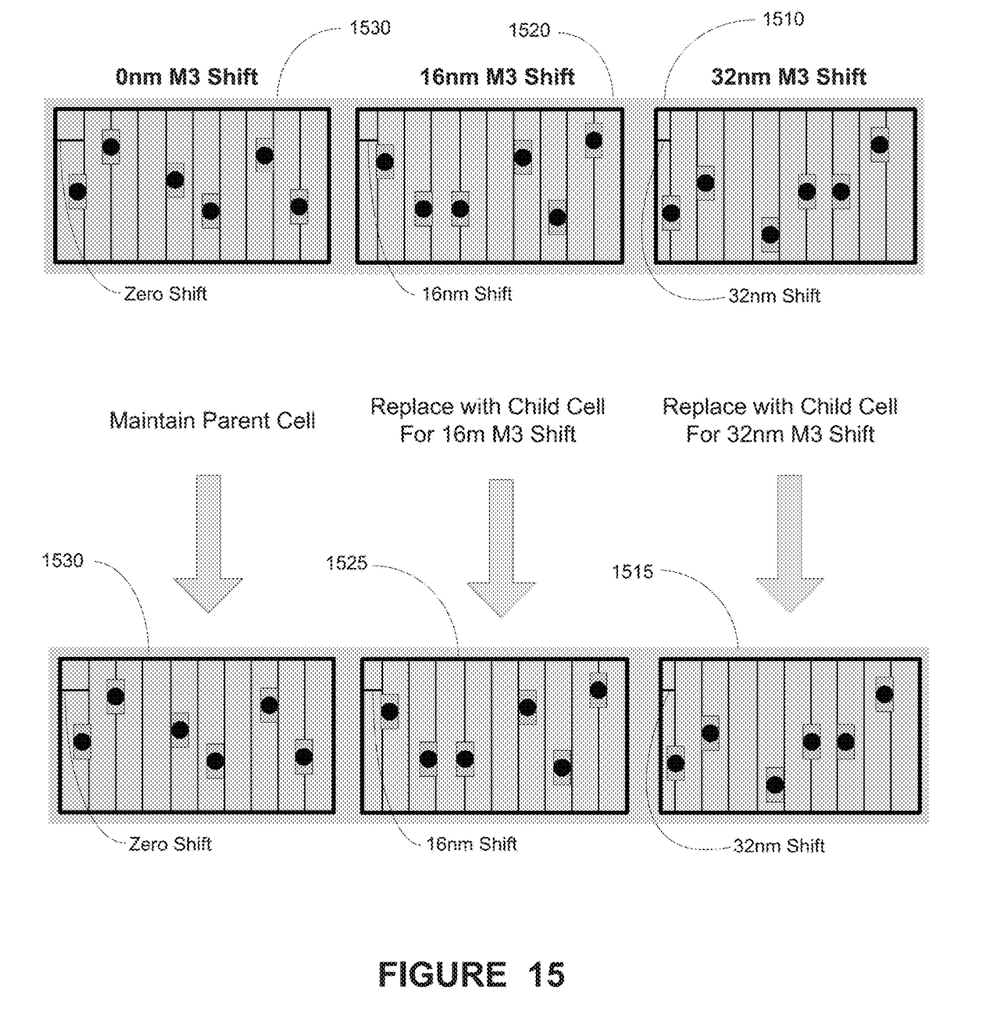
FIG. 15 illustrates a stylized depiction of a set of shifted and non-shifted post-placement cells, in accordance with some embodiments herein.

In this manner, a plurality of cells may be replaced by predetermined substitute cells based upon the amount of shift of a set of routing track that is detected. Referring to FIG. 15, a stylized depiction of a set of shifted and non-shifted post-placement cells, in accordance with some embodiments herein is illustrated. The post-placement cells 1500 includes a first functional cell 1510, a functional second cell 1520, and a third functional cell 1530.

Upon conventional placement of the cells 1510-1530, a determination may be made that the first cell 1510 has a 32 nm shift of a set of vertical routing tracks, the second cell 1520 has a 16 nm shift, and the third cell has a zero shift. A predetermined cell that provides an adjustment of the various horizontal pins to compensate for certain shift may be defined. A substitute cell 1515 for adjusting for a 32 nm cell may be predefined and a substitute cell 1525 for adjusting for a 16 nm cell may also be predefined. Upon post-placement, an evaluation of the shift of the vertical lines relative to the cell borders may be performed.

In this example, the first cell 1510 may comprise a 32 nm shift and the second cell 1520 may comprise a 16 nm shift, and the third cell may have a zero shift. The first and second cells 1510, 1520 may be automatically replaced by corresponding substitute cells 1515, and 1525, respectively. The third cells 1530, which has a zero shift in the vertical lines, is maintained, as indicated in FIG. 15. Therefore, automatic, post-placement adjustments to compensate for shifting of a set of tracking routes in reference to the cell boundary may be performed. Therefore, improved efficiency is space utilization, lowering of DRC errors, and more accurate and efficient routing may be realized.

Figure 16:
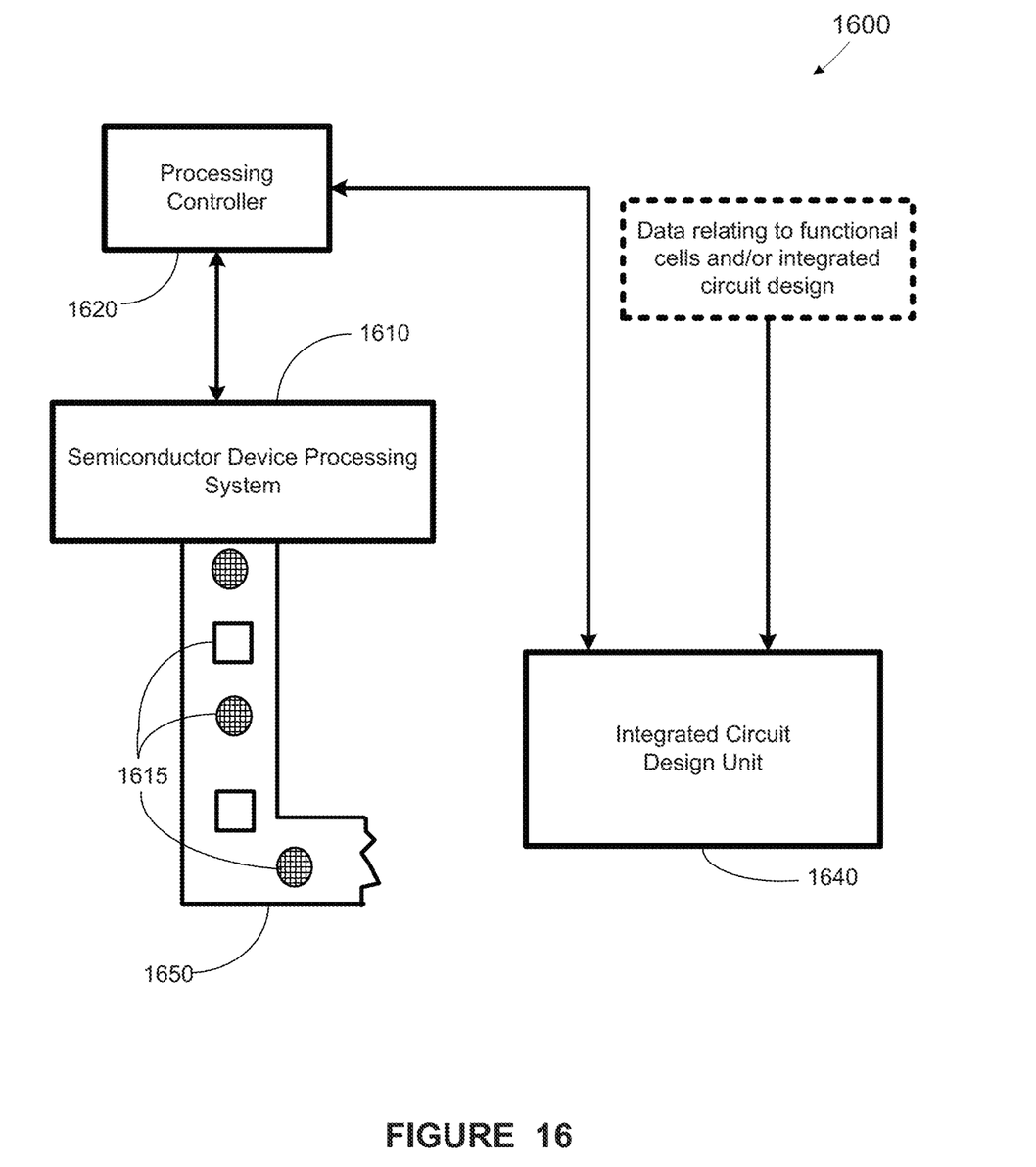
FIG. 16 illustrates semiconductor device processing system 1610 for performing a design process, in accordance with some embodiments herein.

The semiconductor device processing system 1610 may comprise various processing stations, such as etch process stations, photolithography process stations, CMP process stations, etc. One or more of the processing steps performed by the processing system 1610 may be controlled by the processing controller 1620. The processing controller 1620 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1610 may produce integrated circuits on a medium, such as silicon wafers. The production of integrated circuits by the device processing system 1610 may be based upon the circuit designs provided by the integrated circuits design unit 1640. The processing system 1610 may provide processed integrated circuits/devices 1615 on a transport mechanism 1650, such as a conveyor system. In some embodiments, the conveyor system may be sophisticated clean room transport systems that are capable of transporting semiconductor wafers. In one embodiment, the semiconductor device processing system 1610 may comprise a plurality of processing steps, e.g., the $1^{st}$ process step, the $2^{nd}$ process set, etc., as described above.

In some embodiments, the items labeled "1615" may represent individual wafers, and in other embodiments, the items 1615 may represent a group of semiconductor wafers, e.g., a "lot" of semiconductor wafers. The integrated circuit or device 1615 may be a transistor, a capacitor, a resistor, a memory cell, a processor, and/or the like. In one embodiment, the device 1615 is a transistor and the dielectric layer is a gate insulation layer for the transistor.

The integrated circuit design unit 1640 of the system 1600 is capable of providing a circuit design that may be manufactured by the semiconductor processing system 1610. The design unit 1640 may receive data relating to the functional cells to utilize, as well as the design specifications for the integrated circuits to be designed. In one embodiment, the integrated circuit design unit 1640 may perform a cell boundary analysis for determining whether a shifting of a set of routing tracks has occurred. In some embodiments, the integrated circuit design unit 1640 may provide one or more prompt to a user regarding the shift.

In other embodiments, the integrated circuit design unit 1640 may perform an automated determination of the shifts, automatically select a substitute or child, and automatically incorporate the substitute cell into a design. For example, once a designer or a user of the integrated circuit design unit 1640 generates a design using a graphical user interface to communicate with the integrated circuit design unit 1640, the unit 1640 may perform automated modification of the design using substitute cells. In other embodiments, the integrated circuit design unit 1640 may be capable of automatically generating one or more substitute cells, or retrieve one or more substitute cells from library.

The system 400 may be capable of performing analysis and manufacturing of various products involving various technologies. For example, the system 400 may design and production data for manufacturing devices of CMOS technology, Flash technology, BiCMOS technology, power devices, memory devices (e.g., DRAM devices), NAND memory devices, and/or various other semiconductor technologies.

Although in some examples, circuits herein were described in terms of NMOS devices for consistency, those skilled in the art would appreciate that concepts described herein may also apply to PMOS devices and remain within the scope of embodiments herein.

The system 400 may be capable of manufacturing and testing various products that include transistors with active and inactive gates involving various technologies. For example, the system 400 may provide for manufacturing and testing products relating to CMOS technology, Flash technology, BiCMOS technology, power devices, memory devices (e.g., DRAM devices), NAND memory devices, processors, and/or various other semiconductor technologies.

The methods described above may be governed by instructions that are stored in a non-transitory computer readable storage medium and that are executed by, e.g., a processor in a computing device. Each of the operations described herein (e.g., FIGS. 9-11 and 16) may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A method for providing a layout for an integrated circuit device, comprising:
   receiving a design for an integrated circuit device, wherein said design comprises a functional cell comprising a boundary;
   providing a first substitute functional cell for a first value of shift of a set of routing tracks respective to the boundary of said functional cell, said first substitute functional cell comprising at least one pin moved by an amount of said first value;
   determining whether a shift amount of said set of routing tracks corresponds to said first value;
   replacing said functional cell with said first substitute functional cell in response to a determination that said shift amount of said set of routing tracks corresponds to said first value; and
   fabricating said integrated circuit based upon said layout.

2. The method of claim 1, further comprising
   providing a second substitute functional cell for a second value of shift of said set of routing tracks respective to the boundary of said functional cell, said second substitute functional cell comprising at least one pin moved by an amount of said second value;
   determining whether said shift amount of said set of routing tracks corresponds to at least one of said first value or said second value; and
   replacing said functional cell with said first substitute functional cell in response to a determination that said shift amount of said set of routing tracks corresponds to said first value, or replacing said functional cell with said second substitute functional cell in response to a determination that said shift amount of said set of routing tracks corresponds to said second value.

3. The method of claim 2, wherein determining said shift amount comprises determining an amount of post placement shift.

4. The method of claim 1, wherein receiving a design for an integrated circuit device, wherein said design comprises a functional cell comprise receiving a 10 nm design comprising a functional cell having at least one 10 nm component.

5. The method of claim 1, wherein providing a first substitute functional cell for a first value of shift comprises providing said first substitute functional cell for a 32 nm shift of said tracking route.

6. The method of claim 1, wherein providing a first substitute functional cell for a first value of shift comprises providing said first substitute functional cell for a 16 nm shift of said tracking route.

7. The method of claim 1, wherein providing said first substitute functional cell for a first value of shift of a set of routing tracks comprises providing said first substitute functional cell for said first value of shift of a set of vertical routing tracks.

8. The method of claim 7, wherein providing said first substitute functional cell for said first value of shift of said set of vertical routing tracks comprises providing said first substitute functional cell for said first value of shift of an M3 metal layer routing track.

9. The method of claim 7, wherein providing said first substitute functional cell comprising at least one pin moved by said amount of said first value comprises providing said first substitute functional cell comprising at least one horizontal pin moved by an amount of said first value.

10. The method of claim 9, wherein providing said first substitute functional cell comprising at least one horizontal pin moved by an amount of said first value comprises providing said first substitute functional cell comprising at least one M2 metal layer horizontal pin moved by said amount of said first value.

11. A method for providing a layout for an integrated circuit device, comprising:
    placing a functional cell for a design of an integrated circuit device, wherein said functional cell is enclosed within a boundary;
    determining a first shift value of a set of vertical metal layer routing tracks relative to the boundary of the functional cell;
    providing a first substitute functional cell corresponding to said first shift value, wherein said first predetermined substitute functional cell comprises at least one horizontal feature of a metal layer comprising vertical routing tracks shifted by an amount of the first shift value;
    determining whether a shift amount of said set of vertical metal layer routing tracks corresponds to said first shift value;
    substituting said functional cell with said first predetermined substitute functional cell in response to a determination that said shift amount of said set of vertical metal layer routing tracks corresponds to said first shift value; and
    fabricating said integrated circuit based upon said layout.

12. The method of claim 11, further comprising:
    determining a second shift value of said set of vertical metal layer routing tracks relative to the boundary of the functional cell;
    providing a second substitute functional cell corresponding to said second shift value, said second substitute functional cell comprising at least one horizontal feature moved by an amount of said second shift value;
    determining whether said shift amount of said set of vertical metal layer routing tracks corresponds to at least one of said first shift value or said second shift value; and
    replacing said functional cell with said first substitute functional cell in response to a determination that said shift amount of said set of vertical metal layer routing tracks corresponds to said first value, or replacing said functional cell with said second substitute functional cell in response to a determination that said shift amount of said set of vertical metal layer routing tracks corresponds to said second shift value.

13. The method of claim 11, wherein:

determining said first shift value of a set of vertical metal layer routing tracks relative to the boundary of the functional cell comprises determining said first shift value of a set of vertical M3 metal layer routing tracks relative to the boundary of the functional cell; and providing said first substitute functional cell comprising at least one horizontal feature of a metal layer comprising vertical routing tracks comprises providing said first substitute functional cell comprising at least one horizontal feature of an M2 metal layer comprising vertical routing tracks.

14. A system, comprising:

a design unit adapted to:
  receive a design for an integrated circuit device, wherein said design comprises a functional cell within a boundary;
  provide a first substitute functional cell for a first value of shift of a set of routing tracks respective to the boundary of said functional cell, said first substitute functional cell comprising at least one feature moved by an amount of said first value;
  determine whether a shift amount of said set of routing tracks corresponds to said first value; and
  replace said functional cell with said first substitute functional cell in response to a determination that said shift amount corresponds to said first value;

a semiconductor device processing system for fabricating an integrated circuit device based upon said circuit layout; and a processing controller operatively coupled to said semiconductor device processing system, said processing controller configured to control an operation of said semiconductor device processing system.

15. The system of claim 14, wherein:

said set of routing tracks are a set of vertical M3 layer routing tracks; and said feature is a horizontal feature in an M2 metal layer.

16. The system of claim 14, wherein said design unit is further configured to provide a second substitute functional cell for a second value of shift of said set of routing tracks respective to the boundary of said functional cell, said second substitute functional cell comprising at least one pin moved by an amount of said second value;

determine whether said shift amount of said set of routing tracks corresponds to at least one of said first value or said second value; and replace said functional cell with said first substitute functional cell in response to a determination that said shift amount of said set of routing tracks corresponds to said first value, or replacing said functional cell with said second substitute functional cell in response to a determination that said shift amount of said set of routing tracks corresponds to said second value.

17. The system of claim 14, wherein said functional cell comprises a 10 nm component.

18. The system of claim 14, wherein said each of said first value and said second value is 32 nm.

19. The system of claim 14, wherein said each of said first value and said second value is 16 nm.

* * * * *